United States Patent
Kneissl et al.

(10) Patent No.: US 6,990,132 B2
(45) Date of Patent: Jan. 24, 2006

(54) LASER DIODE WITH METAL-OXIDE UPPER CLADDING LAYER

(75) Inventors: Michael A. Kneissl, Mountain View, CA (US); Linda T. Romano, Sunnyvale, CA (US); Christian G. Van de Walle, Sunnyvale, CA (US)

(73) Assignee: Xerox Corporation, Stamford, CT (US)

(*) Notice: Subject to any disclaimer, the term of this patent is extended or adjusted under 35 U.S.C. 154(b) by 383 days.

(21) Appl. No.: 10/394,560

(22) Filed: Mar. 20, 2003

(65) Prior Publication Data

US 2004/0184497 A1    Sep. 23, 2004

(51) Int. Cl.
    *H01S 5/00*    (2006.01)
(52) U.S. Cl. .......................... 372/45; 438/40
(58) Field of Classification Search .................. 372/96, 372/43–50, 75, 92–98, 4
    See application file for complete search history.

(56) References Cited

U.S. PATENT DOCUMENTS

| | | | |
|---|---|---|---|
| 5,493,577 A * | 2/1996 | Choquette et al. ............ 372/46 |
| 5,726,462 A | 3/1998 | Spahn et al. |
| 6,174,747 B1 | 1/2001 | Ho et al. |
| 6,189,340 B1 * | 2/2001 | Burke et al. ................... 65/399 |
| 6,233,265 B1 | 5/2001 | Bour et al. |
| 6,327,413 B1 * | 12/2001 | Kinoshita .................... 385/129 |
| 6,389,051 B1 | 5/2002 | Van de Walle et al. |
| 6,430,202 B1 | 8/2002 | Van de Walle et al. |
| 6,479,836 B1 * | 11/2002 | Suzuki et al. ................. 257/15 |
| 6,693,352 B1 * | 2/2004 | Huang et al. ................ 257/743 |
| 2003/0026515 A1 | 2/2003 | Barenburg et al. |

FOREIGN PATENT DOCUMENTS

| | | |
|---|---|---|
| FR | 2 815 773 A1 | 4/2002 |
| WO | WO 98/07218 A1 | 2/1998 |
| WO | WO 01/93387 A2 | 12/2001 |

* cited by examiner

*Primary Examiner*—Minsun Oh Harvey
*Assistant Examiner*—Tuan N. Nguyen
(74) *Attorney, Agent, or Firm*—Bever Hoffman & Harms, LLP; Patrick T. Bever

(57) ABSTRACT

A nitride-based laser diode structure utilizing a metal-oxide (e.g., Indium-Tin-Oxide (ITO) or Zinc-Oxide (ZnO)) in place of p-doped AlGaN to form the upper cladding layer. An InGaN laser diode structure utilizes ITO upper cladding structure, with an $SiO_2$ isolation structure formed on opposite sides of the ITO upper cladding structure to provide a lateral index step that is large enough to enable lateral single-mode operation. The lateral index step is further increased by slightly etching the GaN:Mg waveguide layer below the $SiO_2$ isolation structure. An optional p-type current barrier layer (e.g., AlGaN:Mg having a thickness of approximately 20 nm) is formed between the InGaN-MQW region and a p-GaN upper waveguide layer to impede electron leakage from the InGaN-MQW region.

19 Claims, 2 Drawing Sheets

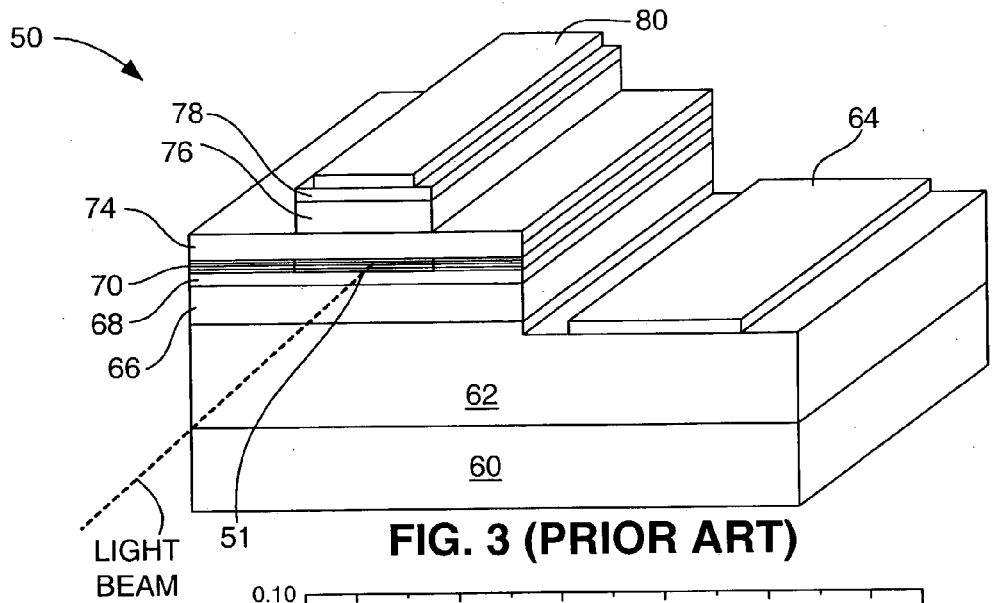
FIG. 3 (PRIOR ART)
LIGHT BEAM
FIG. 4(A) (PRIOR ART)
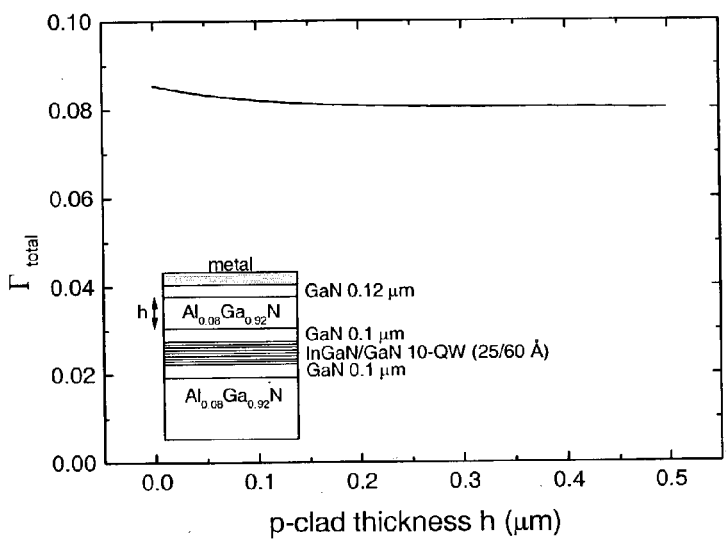
FIG. 4(B) (PRIOR ART)
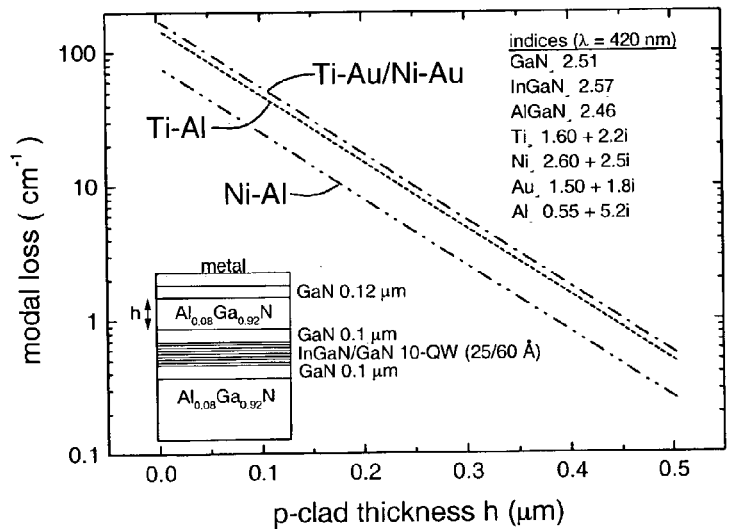

_US 6,990,132 B2_

LASER DIODE WITH METAL-OXIDE UPPER CLADDING LAYER

FIELD OF THE INVENTION

This invention relates to laser diodes, and more particularly to nitride-based laser diode structures.

BACKGROUND OF THE INVENTION

Laser diodes are used in many laser applications, such as in laser printing, optical data storage, long-haul fiber communication, spectroscopy, metrology, barcode scanners, and fiber amplifier pump sources. Laser diode structures generally include a central waveguide/quantum well "active" region flanked by upper and lower cladding layers. This configuration is also known as separate confinement heterostructure (SCH). Because of its high refractive index, light is confined to this active region "core" of the structure, where optical gain is produced. The upper and lower cladding layers are formed from material having a lower refractive index than the core, and serve to contain the optical mode. This arrangement guides the optical mode along the active region core, creating a laser light beam that is emitted from a face of the structure.

FIG. 3 is a simplified perspective view depicting a conventional Indium-Gallium-Nitride (InGaN) multi-quantum-well (MQW) laser diode 50, which is exemplary of the type of nitride-based laser diode specifically addressed by the present invention. Referring to the lower portion of FIG. 3, laser diode 50 includes an n-doped layer 62 (e.g., Silicon-doped Gallium-Nitride (GaN:Si)) formed on a substrate 60 (e.g., Sapphire ($Al_2O_3$), Silicon-Carbide (SiC), Aluminum-Nitride (AlN), or Gallium-Nitride (GaN)). An n-electrode 64 (e.g., a Titanium-Aluminum (Ti/Al) or Titanium-Gold (Ti/Au) bilayer) and an n-doped cladding layer 66 (e.g., Si-doped Aluminum-Gallium-Nitride (AlGaN:Si)) are formed on n-doped layer 62. A stack is formed on n-doped cladding layer 66 that includes an n-doped waveguide layer 68 (e.g., GaN:Si), a multiple quantum well (MQW) region 70 including multiple (e.g., three) InGaN quantum wells separated by GaN barrier layers, a p-doped waveguide layer 74 (e.g., GaN:Mg), a p-doped cladding layer 76 (e.g., AlGaN:Mg), a second p-doped contact layer 78 (e.g., GaN:Mg), and a p-electrode 80 (e.g., a Ni/Au bilayer). During the operation of InGaN MQW laser diode 50, a suitable voltage potential is applied to n-electrode 64 and p-electrode 80. The respective n-type and p-type materials inject electrons and holes from these electrodes to the p-n junction provided by MQW region 70, which produces a highly coherent (in this case blue-violet) laser beam LB that is emitted from an area 51 located on a face of laser diode 50. In general, the purpose of the waveguide and cladding layers is to confine the optical mode to a central (core) region of MQW region 70 associated with area 51. This is achieved by forming waveguide layers 68 and 74 from materials having relatively high refractive indexes (although lower than that of MQW region 70), and cladding layers 66 and 76 from materials having relatively low refractive indexes. For several reasons, cladding layers 66 and 76 are formed by adding Al to the material used to form waveguide layers 68 and 74, along with an appropriate dopant (e.g., Si or Mg).

It is critical that laser diodes be precisely formed and made from materials of excellent structural and optoelectronic quality in order to optimize the emitted laser beam. Structural defects (such as dislocations or cracks) or impurities can seriously degrade the luminescence efficiency of the semiconductor materials. In addition, the thickness and shape of the various layers are important to optimize the emitted laser beam.

A problem associated with the use of AlGaN:Mg to produce upper cladding layer 76 of InGaN laser diode 50 (FIG. 3) is that both the thickness and Al concentration are limited by cracking, which then limits the refractive index difference between upper cladding layer 76 and waveguide layer 74 and the active region formed by MQW region 70, and consequently limits the resulting optical confinement. In addition, it is difficult to achieve a high hole concentration in AlGaN alloys because the ionization energy of Mg acceptors increases with increasing Al content. Therefore, Mg doped AlGaN cladding layers increase the series resistance, and ultimately produce undesirable heating of InGaN laser diode 50 during operation. Furthermore, reliable control of the lateral optical mode has proven to be difficult in conventional InGaN laser devices, where typically a ridge-waveguide structure is employed for lateral confinement of the optical mode. A lateral index step is achieved by dry-etching upper AlGaN:Mg cladding layer 76. Because there is no reliable selective etch process known for AlGaN, the etch depth and the resulting index step are difficult to control.

FIGS. 4(A), and 4(B) are graphs depicting modeling data associated with conventional nitride laser diode structure 50 having a ten-InGaN/GaN MQW region 70 and an upper cladding layer 76 comprising $Al_{0.08}Ga_{0.92}N$:Mg. FIG. 4(A) is a graph showing calculated confinement factors Γ depending on the AlGaN:Mg cladding layer thickness, and indicates a confinement factor Γ of the optical mode is expected to be around 0.08. FIG. 4(B) is a graph showing calculated metal absorption loss for a conventional 10 InGaN/GaN-MQW laser diode structure for different top p-electrode metal layers as a variation of the AlGaN:Mg cladding layer thickness. As indicated, the absorption loss from the top p-metal layer in such a structure depends greatly on the thickness of the AlGaN:Mg cladding layer. In order to achieve reasonable low loss values (~1 $cm^{-1}$), a cladding layer thickness in the range of 400–500 nm is necessary. Further, these loss values are only a lower estimate, not taking into account the losses due to surface roughness (e.g., induced by the metal alloy fabrication process) or metal penetrating into the (Al)GaN layers. Therefore, in order to improve the optical confinement and reduce absorption loss, the AlGaN:Mg layer ideally should be kept as thick as possible. However, as set forth above, AlGaN:Mg contributes significantly to the series resistance of the device, and also has to be kept thin enough in order to avoid cracking, which degrades the optoelectronic quality of the laser diode. An AlGaN:Mg free device structure would therefore be beneficial in order to overcome these two problems.

What is needed is an index guided single-mode laser diode structure that does not include a p-AlGaN cladding layer, while still maintaining the same optical confinement factor and avoiding significant absorption loss in the p-metal. In addition, the series resistance in the laser diode should be largely reduced. The laser diode structure must also provide a strong (index-guided) lateral confinement, which could be beneficial in order to achieve stable single-mode operation of the laser diode devices.

SUMMARY OF THE INVENTION

The present invention is directed to a laser diode structure that includes an upper cladding layer formed from a conductive metal-oxide (e.g., Indium-Tin-Oxide (ITO) or Aluminum-doped Zinc-Oxide (ZnO)), thereby providing several advantages over conventional ridge-waveguide laser diode structures having conventionally-formed upper cladding layers. The use of a metal-oxide upper cladding layer is shown to be beneficial in nitride-based (e.g., InGaN) laser diode structures that conventionally utilize Aluminum-Gallium-Nitride doped with Magnesium (i.e., AlGaN:Mg) to form the p-doped upper cladding layer (however, the use of metal-oxide upper cladding layers may benefit other types of laser diode structures as well). For example, in nitride-based laser diode structures, the metal-oxide cladding layer provides better control over the lateral index step and lateral mode profile than that provided by conventional cladding materials such as AlGaN:Mg. Second, the conductive metal-oxide cladding layer provides less series resistance than conventional cladding materials such as AlGaN:Mg. Third, the metal-oxide cladding layer provides enhanced transverse optical confinement and modal gain when compared to that of conventional AlGaN-based laser diode structures. Fourth, the use of metal-oxide to form the upper cladding layer greatly simplifies the fabrication process because it can be selectively wet etched, whereas AlGaN:Mg must be carefully dry etched to prevent damage to the underlying GaN:Mg waveguide layer typically utilized in AlGaN-based laser diode structures. This simplification of the fabrication process contributes to lower manufacturing costs than those associated with conventional AlGaN-based laser diode structures.

In accordance with a specific embodiment of the present invention, an AlGaN-based laser diode structure includes an n-type lower cladding layer (e.g., AlGaN:Si), an n-type lower waveguide layer (e.g., GaN:Si) formed on the lower cladding layer, an InGaN-based multiple quantum well (InGaN-MQW) region formed on the lower waveguide layer, a p-type upper waveguide layer (e.g., GaN:Mg) formed over the InGaN-MQW, an ITO upper cladding layer formed on the upper waveguide layer, and an electrode (e.g., TiAu) formed on the ITO upper cladding layer. ITO has a much higher conductivity than AlGaN:Mg, and therefore its use as a cladding material reduces the operating voltages when compared with conventional nitride-based laser diode structures having thick AlGaN:Mg cladding layers. In addition, because ITO has a refractive index that is substantially lower than GaN, ITO provides a sufficiently large refractive index step to serve as the upper cladding layer in laser diode structures utilizing p-GaN to form the upper waveguide layer. Further, calculations show that the total optical confinement factor for laser diodes structures using ITO upper cladding layers is greater than the confinement factor for conventional devices with p-AlGaN upper cladding layers, and should therefore result in enhanced modal gain and lower threshold current densities. Moreover, utilizing ITO to form the upper cladding layer greatly simplifies production by allowing selective wet or dry etching of the ITO (i.e., without etching the underlying GaN waveguide layer).

In accordance with another aspect of the specific embodiment, $SiO_2$ isolation layer portions are formed on opposite sides of the ITO upper cladding structure. The combination of ITO cladding and the $SiO_2$ isolation structures provides a lateral index step that is large enough to enable lateral single-mode operation of the laser diode structure. In an alternative embodiment, the lateral index step is further increased by slightly etching the GaN:Mg waveguide layer below the $SiO_2$ isolation layer portions.

In accordance with another embodiment of the present invention, an optional p-type current barrier layer (e.g., AlGaN:Mg having a thickness of approximately 20 nm) is formed between the InGaN-MQW region and a p-GaN upper waveguide layer to impede electron leakage from the InGaN-MQW region.

BRIEF DESCRIPTION OF THE DRAWINGS

These and other features, aspects and advantages of the present invention will become better understood with regard to the following description, appended claims, and accompanying drawings, where:

FIG. 3 is a perspective view showing a conventional InGaN-based laser diode structure; and FIGS. 4(A) and 4(B) are graphs showing calculated confinement factors and metal absorption losses for a conventional InGaN-based laser diode structure.

DETAILED DESCRIPTION OF THE DRAWINGS

The present invention is described below with particular reference to InGaN-based laser diode structures. While the present invention is believed to be particularly useful in conjunction with InGaN-based laser diode structures, aspects of the present invention may be utilized in other nitride-based laser diode structures as well, and may also be utilized in some non-nitride-based laser diode structures (e.g., Gallium-Arsenide (GaAs) or Indium-Phosphate (InP) laser diode structures). For example, in an InP-based laser diode used as a chemical sensor, it may be useful to utilize a metal-oxide (e.g., ZnO) in the manner described herein because of its biocompatibility and sensitivity to hydrogen. Therefore, it is the intent of the inventors that the scope of the present invention not necessarily limited by the specific embodiments described herein unless such limitations are specifically included in the appended claims.

Figure 1:
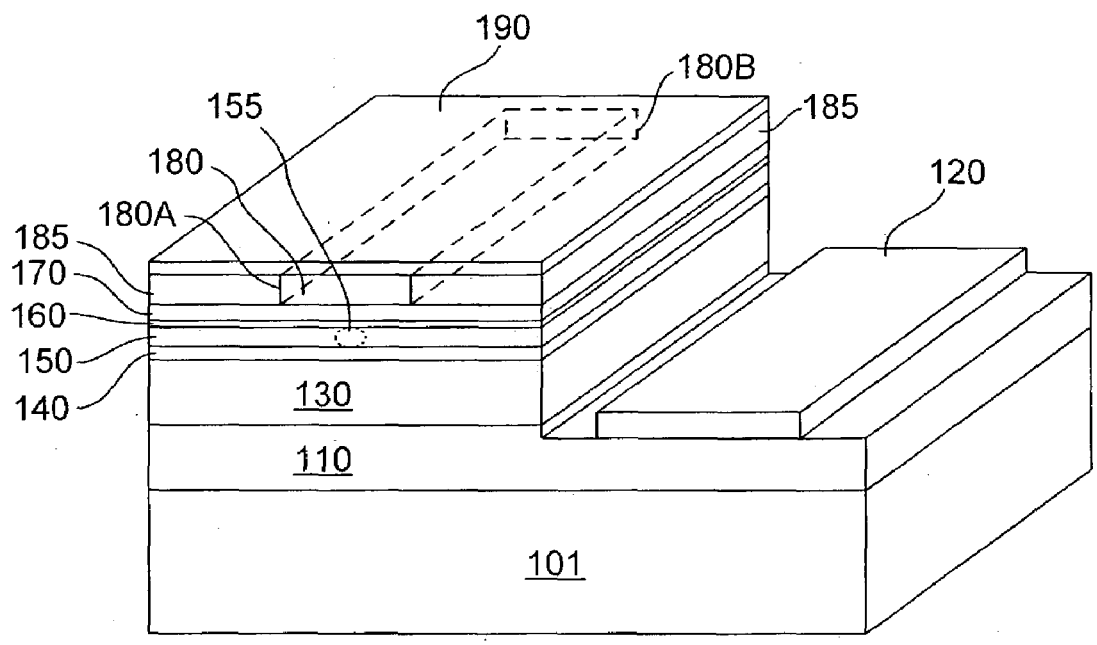
FIG. 1 is a perspective view showing an InGaN-based laser diode structure according to the present invention.

FIG. 1 is a front elevation view showing a nitride-based laser device structure 100 according to an embodiment of the present invention. Laser device structure 100 is formed on a substrate 101 (e.g., (, Sapphire $Al_2O_3$), Silicon-Carbide (SiC), Aluminum-Nitride (AlN), or Gallium-Nitride (GaN)), and includes a n-type contact layer 110 (e.g., GaN:Si or AlGaN:Si) formed on substrate 101. An n-electrode 120 (e.g., Ti/Au, Ti/Al, Ti/Al/Au, or Ti/Al/Mo/Au) is formed on a first (exposed) region of n-type contact layer 110, and an n-type lower cladding layer 13.0 (e.g., AlGaN:Si) is formed on a second region of N-type contact layer 110. An n-type lower waveguide layer 140 (e.g., GaN:Si, InGaN:Si, or AlGaN:Si) is formed on lower cladding layer 130. Note that the refractive index of lower waveguide layer 140 is larger than the refractive index of lower cladding layer 130. A multiple quantum well (MQW) region 150 (e.g., three InGaN quantum well layers sandwiched between corresponding GaN or InGaN barrier layers) is formed on lower waveguide layer 140. An optional p-type confinement layer 160 (e.g., AlGaN:Mg) is formed on MQW region 150. A p-type upper waveguide layer 170 (e.g., GaN:Mg, AlGaN:Mg or InGaN:Mg) is formed on confinement layer 160. An upper cladding layer 180 is formed on upper waveguide layer 170 and located over an active region 155 of MQW region 150. Optional isolation layer portions 185 are formed on opposite sides of upper cladding layer 180. Finally, a p-electrode 190 (e.g., Ti/Au, Ti/Al, Ti/Al/Au, Ti/Al/Mo/Au, Ni/Au, or Ni/Al) is formed on upper cladding layer 180 and isolation layer portions 185 (when used). The various Group III-nitride layers of laser device structure 100 that are shown in FIG. 1 and mentioned above are formed using metal organic chemical vapor deposition (MOCVD), which is a well known deposition technique (see, for example, "Organometallic Vapor-Phase Epitaxy: Theory and Practice", G. B. Stringfellow, Academic Press, 1989).

According to an aspect of the present invention, upper cladding layer 180 is formed using a conductive metal-oxide selected from the group including Indium-Tin-Oxide (ITO), Zinc-Oxide (ZnO), Cadmium-Oxide (CdO), Indium-Oxide ($In_2O_3$), and Tin-Oxide ($SnO_2$). Several ternary conductive metal oxides may also be used (e.g., $Zn_2SnO_4$, $ZnSnO_3$, and $Cd_2NsO_4$). In addition, these oxides can be doped to increase their conductivity. For example, ZnO can be doped with Al, Ga, In, Fluorine (F), and/or Boron (B) to make the ZnO highly n-type (typical carrier concentrations-are approximately $10^{18}$ cm$^{-3}$ to $2 \times 10^{21}$ cm$^{-3}$). It may also be possible to make these oxides p-type using similar doping techniques (e.g., nitrogen-doping might be used to create p-type ZnO). Note that ITO is another example of a doped oxide (the chemical formula of ITO is $Zn_{2-x}Sn_xO_3$). In the case of ITO, the Sn acts as the n-dopant in the $In_2O_3$ matrix. Conductive oxide layers can be deposited by continuous well-known deposition techniques. These techniques include sputtering (e.g., R. F. sputtering or R. F. magnetron sputtering), evaporation, or pulsed laser deposition. Chemical vapor deposition (CVD) is another method of depositing conductive metal films. Note that MOCVD is a CVD technique that facilitates the deposition of high quality crystalline films.

As set forth in the examples provided below, utilizing a metal-oxide material such as ITO to form upper cladding layer 180, particularly when combined with isolation layer portions 185 formed using a suitable dielectric material (e.g., $SiO_2$), produces an nitride-based laser diode structure that has several advantages over conventional nitride-based laser diode structures formed with AlGaN:Mg upper cladding layers. For example, metal-oxides such as ITO and ZnO have a lower series resistance than AlGaN:Mg. Therefore, nitride-based laser device structure 100 avoid the heating problem associated with conventional nitride-based laser structures having upper cladding layers including AlGaN:Mg. Other advantages associated with the use of metal-oxide cladding structures are set forth below.

Referring again to FIG. 1, upper cladding layer 180 is formed into an elongated stripe (or ridge) structure having opposing side walls 180A and 180B (indicated by dashed lines) that extend substantially perpendicular to an upper surface of waveguide layer 170. The thus-formed upper cladding layer 180 defines the lateral index step and provides lateral single mode operation during lasing. This elongated structure is typically formed by depositing a continuous layer of cladding material, and then etching portions of the continuous layer to form the elongated structure having side walls 180A and 180B. As set forth above, in conventional nitride-based laser diode structures the upper cladding layer 180 typically includes AlGaN:Mg, which must be dry-etching to form a suitable ridge-waveguide structure because there is no reliable selective etch process known for AlGaN. Therefore, the etch depth and the resulting index step are difficult to control in conventional nitride-based laser diode structures using upper cladding layers formed using AlGaN:Mg. In contrast, metal-oxide can be selectively wet or dry etched using well-established techniques (e.g., wet etch using HCl or HF diluted 10:1 with $H_2O$; plasma dry etch in $CF_4O_2$ gas mixture), thereby providing a clear advantage over AlGaN:Mg cladding layers by avoiding over-etching that can undesirably alter the index step of the laser structure. This ability to selectively etch the cladding material simplifies the fabrication process, thereby reducing the manufacturing costs associated with producing nitride-based laser device structure 100. Further, as set forth below, the ability to selectively etch the cladding material is also important because the thickness of waveguide layer 170 is very important to the performance of nitride-based laser device structure 100.

As mentioned above, isolation layer portions 185 are formed on opposite sides of upper cladding layer 180 (see FIG. 1). In order to obtain lateral single mode operation, a lateral effective refractive index step is obtained by surrounding conductive oxide layer stripe 180 with a lower refractive index material (typical stripe width is between 1 to 4 microns). As set forth in additional detail below, this control function is particularly enhanced when upper cladding layer is formed using ITO and isolation layer portions 185 are formed using $SiO_2$, but beneficial structures can also be formed using different electrically isolating dielectric materials having a lower refractive index (e.g., air, $Si_3N_4$, or $Si_xO_yN_z$). Dielectric isolation layer portions 185 also provide electric isolation between the wide p-electrode 190 and the underlying p-GaN waveguide layer 170, such that current is only funneled into the active region underneath metal-oxide cladding stripe 180.

According to another aspect of the present invention, optional tunnel barrier layer 160 (e.g., a layer of AlGaN:Mg having a thickness in the range of 5 to 50 nm, preferably approximately 20 nm, for a GaN:Mg waveguide layer having a thickness in the range of 80 to 200 nm, preferably 120 nm) may be utilized in nitride-based laser diode structures to prevent leakage of electrons from of MQW region 150. In one embodiment, the Al content in tunnel barrier layer 160 is in the range of 10 to 30% (mole fraction). While tunnel barrier layer 160 having Al contents in this range may be necessary in some nitride-based laser diode structures in order to achieve lasing, it is possible to form nitride-based laser structures that do not require tunnel barrier layer 160. For example, U.S. Pat. Nos. 6,389,051 6,430,202, both entitled Structure and Method for Asymmetric Waveguide Nitride Laser Diode (incorporated herein by reference in their entirety) disclose an arrangement in which Al is added to upper waveguide layer 170 in an amount high enough to achieve the desired band gap offset. In one example, AlGaN:Mg lower waveguide layer 170 has an Al content of 8% (mole fraction) and has a thickness of 120 nm (i.e., similar to that used in the specific example provided below). The lower waveguide 140 in this example is GaN.

Referring again to FIG. 1, according to a specific embodiment, an AlGaN laser diode structure 100 is constructed according to the following specifications. Lower cladding layer 130 includes AlGaN:Si having a thickness of approximately 1,000 nm. Lower waveguide layer 140 includes GaN:Si having a thickness of approximately 100 nm. InGaN-MQW region 150 includes three InGaN quantum well layers having thicknesses in the range of 3 to 4 nm, with GaN layers in the range of 6 to 7 nm formed between the InGaN quantum well layers, and a 3 nm GaN capping layer. Barrier layer 160 is formed on the capping layer, and includes AlGaN:Mg having a thickness of approximately 20 nm. Upper waveguide layer 170 includes GaN:Mg having a thickness in the range of 50 to 200 nm, and most preferably approximately 120 nm for reasons described below. Upper cladding layer 180 includes ITO having a thickness in the range of 100 to 1000 nm (e.g., approximately 200 nm).

Isolation layer portions 185 include $SiO_2$, and have thicknesses that are greater than 100 nm (see alternative embodiment described below for exception). Finally, p-electrode 190 includes Ti/Au having a thickness of approximately 1020 nm (e.g., 20 nm Ti, 1000 nm Au).

The use of ITO to form upper cladding layer 180 is beneficial for several reasons. ITO has been shown to be highly conductive ($\rho \sim 5*10^{-4}$ $\Omega$cm) and forms a good ohmic contact to GaN:Mg (e.g., Margalith et. al, Appl. Phys. Lett. Vol 74, 3930 (1999)). Further, because ITO has a lower refractive index ($n_r = 2.06@420$ nm) than GaN ($n_r \sim 2.5$), it provides a sufficiently large refractive index step to serve as upper cladding layer 180 in the laser diode structure. Although ITO is not completely transparent in the wavelength region around 400 nm ($\alpha \sim 700$ cm$^{-1}$@$\lambda$=420 nm), the calculated modal loss for laser diode 100, where cladding layer 180 and isolation layer 185 are 200 nm thick and are made up of ITO and $SiO_2$, respectively, was found to be below 1 cm$^{-1}$. This modal loss is much smaller than the distributed loss found in InGaAlN laser diodes, which is typically in the range of 20 cm$^{-1}$ to 60 cm$^{-1}$, and even lower than the loss found in conventional structures using AlGaN cladding layers.

As shown in Table 1 (below) and in FIG. 2, the total optical confinement factor $\Gamma$ for the structure with ITO cladding layer 180 and a three-quantum-well active region 150 is around 3.6%. In particular, Table 1 shows calculated confinement factors and modal losses (from absorption in top metal and/or ITO) for a conventional InGaN laser diode structure having a 500 nm AlGaN:Mg upper cladding layer and InGaN laser diode structure 100 of the specific embodiment (set forth above). For the calculation of the modal loss, absorption in p-electrode 190 and in the ITO cladding layer (assuming an absorption coefficient of $\alpha \sim 700$ cm$^{-1}$ for ITO) were taken into account. All other layers in the laser structures were assumed to be loss-free. Note that the confinement factor for the ITO cladding structure is greater than the confinement factor for conventional devices with an AlGaN:Mg upper cladding layer ($\Gamma \sim 3.0\%$), and should therefore result in enhanced modal gain and lower threshold current densities.

TABLE 1

| Structure | $\Gamma$ | $\alpha$ |
|---|---|---|
| 500 nm AlGaN clad | 1.01% per QW | 1.6 cm$^{-1}$ |
| 200 nm ITO clad | 1.21% per QW | 0.005 cm$^{-1}$ |

Figure 2:
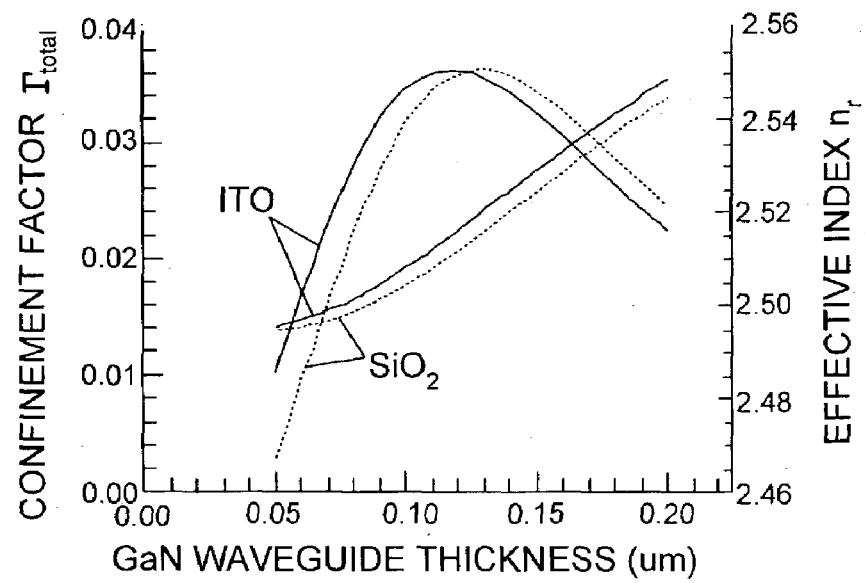
FIG. 2 is a graph relating the confinement factor and effective index to waveguide thickness in the InGaN-based laser diode structure shown in FIG. 1.

Table 1 and FIG. 2 also indicate that the effective refractive index for the transverse optical mode guided underneath the $SiO_2$ isolation layer portions 185 is smaller than the optical mode under the ITO cladding layer 180. The calculated lateral index step is about 0.005, which is sufficiently large to enable lateral single-mode operation. If necessary, the lateral index step can be further enhanced by slightly etching in the GaN:Mg waveguide layer 170 before deposition of the $SiO_2$ dielectric, or by using a different electrically isolating dielectric material with a lower refractive index (e.g., air). For example, by removing 20 nm of GaN:Mg from upper waveguide layer 170 in the area of the $SiO_2$ isolation layer portions 185, the lateral index step can be increased to 0.012.

FIG. 2 also indicates that the confinement factor and effective index under the ITO cladding is maximized when waveguide layer 170 has a thickness of approximately 120 nm. However, as indicated, beneficial results can be achieved using waveguide thicknesses over the entire range disclosed in FIG. 2 (i.e., 50 to approximately 200 nm).

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A laser diode structure comprising:
   a quantum well region;
   a waveguide layer formed over the quantum well region; and
   a conductive metal-oxide cladding layer formed on the waveguide layer,
   wherein the quantum well region comprises alternating layers of Indium-Gallium-Nitride and Gallium-Nitride, and
   wherein the waveguide layer comprises Gallium-Nitride doped with Magnesium (GaN:Mg).

2. The laser diode structure according to claim 1, wherein the metal-oxide cladding layer comprises at least one of Indium-Tin-Oxide (ITO), Zinc-Oxide (ZnO), Cadmium-Oxide (edo), Tin-Oxide (SnO).

3. The laser diode structure according to claim 1,
   wherein the waveguide layer comprises a thickness in the range of 50 to 200 nm, and
   wherein the metal-oxide cladding layer comprises at least one of Indium-Tin-Oxide (ITO), Zinc-Oxide (ZnO), Cadmium-Oxide (CdO), Tin-Oxide (SnO).

4. The laser diode structure according to claim 3, wherein the metal-oxide cladding layer comprises ITO having a thickness in the range of 200 and 1000 nm.

5. A laser diode structure comprising:
   a quantum well region;
   a waveguide layer formed over the quantum well region; and
   a conductive metal-oxide cladding layer formed on the waveguide layer,
   wherein the metal-oxide cladding layer comprises first and second side walls extending perpendicular to an upper surface of the waveguide layer, and wherein the laser diode structure further comprising an isolation layer formed on the waveguide layer and including a first portion contacting the first side wall of the metal-oxide cladding layer, and a second portion contacting the second side wall of the metal-oxide cladding layer.

6. The laser diode structure according to claim 5, wherein the metal-oxide cladding layer comprises at least one of Indium-Tin-Oxide (ITO), Zinc-Oxide (ZnO), Cadmium-Oxide (CdO), Tin-Oxide (SnO), and wherein the isolation layer comprises one of Silicon-Oxide ($SiO_2$), Silicon-Nitride ($Si_3N_4$), Silicon-Oxy-Nitride (SiON) and air.

7. The laser diode structure according to claim 5,
   wherein the quantum well region comprises alternating layers of Indium-Gallium-Nitride and Gallium-Nitride,
   wherein the waveguide layer comprises Gallium-Nitride doped with Magnesium (GaN:Mg) and having a thickness in the range of 50 to 200 nm, and
   wherein the metal-oxide cladding layer comprises ITO having a thickness in the range of 100 to 1000 nm, and
   wherein the isolation layer comprises $SiO_2$ having a thickness in the range of 50 to 500 nm.

8. The laser diode structure according to claim 7, further comprising a metal electrode formed on an upper surface of the ITO cladding layer.

9. The laser diode structure according to claim 7, wherein a thickness of a first portion of the waveguide layer located under the metal-oxide cladding layer is in a range of approximately 5 nm to approximately 50 nm thicker than a second portion of the waveguide layer located under the isolation layer.

10. The laser diode structure according to claim 1, further comprising a current barrier layer formed between the quantum well region and the waveguide layer.

11. The laser diode structure according to claim 10,
wherein the current barrier layer comprises Aluminum-Gallium-Nitride doped with Magnesium (AlGaN:Mg) and having a thickness in the range of 5 to 50 nm,
wherein the waveguide layer comprises a thickness in the range of 50 to 200 nm, and
wherein the metal-oxide cladding layer comprises one of Indium-Tin-Oxide (ITO) and Zinc-Oxide (ZnO) having a thickness in the range of 100 to 1000 nm.

12. A method for fabricating a laser diode structure comprising:
forming a quantum well region;
forming a waveguide layer over the quantum well region; and
forming a conductive metal-oxide cladding layer on the waveguide layer,
wherein forming the quantum well region comprises forming alternating layers of Indium-Gallium-Nitride and Gallium-Nitride, and
wherein forming the waveguide layer comprises depositing Gallium-Nitride doped with Magnesium (GaN:Mg).

13. The method according to claim 12, wherein forming the metal-oxide cladding layer comprises depositing at least one of Indium-Tin-Oxide (ITO), Zinc-Oxide (ZnO), Cadmium-Oxide (CdO), Tin-Oxide (SnO).

14. The method according to claim 12, wherein forming the metal-oxide cladding layer comprises depositing ITO to a thickness in the range of 100 to 1000 nm.

15. The method according to claim 12, wherein forming the metal-oxide cladding layer comprises depositing an Indium-Tin-Oxide (ITO) layer, and then etching portions of the ITO layer to form an ITO structure having side walls extending perpendicular to an upper surface of the waveguide layer.

16. The method according to claim 15, further comprising forming an isolation layer on the waveguide layer adjacent to the ITO structure such that the isolation layer includes a first portion contacting the first side wall of the ITO structure, and a second portion contacting the second side wall of the ITO structure.

17. The method according to claim 16, wherein forming the isolation layer comprises depositing Silicon-Oxide (SiO$_2$).

18. The method according to claim 17, wherein forming the waveguide layer comprises etching portions of the waveguide layer such that the SiO$_2$ is deposited on the etched portions.

19. The method according to claim 17, wherein the etched portions have a thickness in the range of 50 to 100 nm.

* * * * *

UNITED STATES PATENT AND TRADEMARK OFFICE
CERTIFICATE OF CORRECTION

PATENT NO. : 6,990,132 B2
DATED : January 24, 2006
INVENTOR(S) : Michael A Kneissl et al.

It is certified that error appears in the above-identified patent and that said Letters Patent is hereby corrected as shown below:

<u>Column 1,</u>
Line 3, insert as a new paragraph:
-- This invention was made with Government support under Agreement No. MDA972-96-3-0014 awarded by ARPA. The Government has certain rights in this invention. --.

Signed and Sealed this

Twenty-third Day of May, 2006

JON W. DUDAS
*Director of the United States Patent and Trademark Office*